US006323512B1

(12) United States Patent
Noh et al.

(10) Patent No.: US 6,323,512 B1
(45) Date of Patent: Nov. 27, 2001

(54) NONVOLATILE FERROELECTRIC CAPACITOR AND NONVOLATILE FERROELECTRIC MEMORY

(75) Inventors: Tae-Won Noh; Bae-ho Park; Bo-Soo Kang; Sang-Don Bu, all of Seoul (KR)

(73) Assignee: Tae-Won Noh, Seoul (KR)

( * ) Notice: Subject to any disclaimer, the term of this patent is extended or adjusted under 35 U.S.C. 154(b) by 0 days.

(21) Appl. No.: 09/520,691

(22) Filed: Mar. 7, 2000

(30) Foreign Application Priority Data

Mar. 10, 1999 (KR) .................................................. 99-08012

(51) Int. Cl.$^7$ .................................................. H01L 29/76
(52) U.S. Cl. ........................ 257/295; 257/296; 257/298; 438/3; 438/238; 438/239; 438/386; 438/399
(58) Field of Search .................................. 257/295, 296, 257/298; 438/3, 238, 239, 386, 399

(56) References Cited

U.S. PATENT DOCUMENTS

| | | |
|---|---|---|
| 5,479,317 | * 12/1995 | Ramesh . |
| 5,491,102 | 2/1996 | Desu et al. . |
| 5,519,234 | 5/1996 | Paz de Araujo et al. . |

FOREIGN PATENT DOCUMENTS

| | | |
|---|---|---|
| 653784-A1 | * 5/1995 | (EP) . |
| 07-058222 | 3/1995 | (JP) . |

OTHER PUBLICATIONS

S.J. Hyun, G. H. Park, S.D. Bu,, J. H. Jung and T.W. Non, Nonferroelectric Epitaxial Sr–Bi–Ta Oxide Thin Film With a High Dielectric Constant, Applied Physics Letters, 1998 American Institute of Physics, 3 pages, vol. 73, No. 17, Oct. 26, 1998.

E. C. Subbarao, Crystal Chemistry of Mixed Bismuth Oxides With Layer–Type Structure, Research Laboratories, Westinghouse Electric Corporation, Pittsburgh, Pennsylvania, 4 pages, presented at Sixty–Third Annual Meeting, The American Ceramic Society, Toronto, Ontario, Canada, Apr. 24, 1961.

G.A. Smolenskii, V. A. Isupov and A. I. Agranovskaya, Ferroelectrics of the Oxygen–Octahedral Type with Layered Structure, Soviet Physics —Solid State, 6 pages, vol. 3, No. 3, Sep., 1961, provided by The British Library, Boston Spa, Wetherby, West Yorkshire, United Kingdom.

* cited by examiner

Primary Examiner—Nathan Flynn
Assistant Examiner—Kevin Quinto
(74) Attorney, Agent, or Firm—Senniger, Powers, Leavitt & Roedel

(57) ABSTRACT

A nonvolatile ferroelectric capacitor comprising $Bi_{4-x}A_xTi_3O_{12}$ thin film which is obtained by substituting at least some atoms of nonvolatile element A such as La for volatile Bi atoms in $Bi_4Ti_3O_2$. Nonvolatile element A in perovskite layer of $B_{4-x}A_xTi_3O_{12}$ suppress the generation of oxygen vacancies in the perovskite layer, thereby improving fatigue behavior.

5 Claims, 8 Drawing Sheets $SrBi_2Ta_2O_9$ $Bi_4Ti_3O_{12}$ $Bi_{4-x}La_xTi_3O_9$

NONVOLATILE FERROELECTRIC CAPACITOR AND NONVOLATILE FERROELECTRIC MEMORY

BACKGROUND OF THE INVENTION

1. Field of the Invention

The present invention relates to a nonvolatile ferroelectric capacitor for nonvolatile semiconductor memory. More specifically, the present invention relates to a nonvolatile ferroelectric capacitor comprising layered perovskite ferroelectric thin film made of $Bi_{4-x}A_xTi_3O_{12}$ for FeRAM (ferroelectric random access memory) application.

2. Description of the Related Art

DRAM (Dynamic Random Access Memory) typically used in computer main memory systems can provide a low cost RAM solution with high integration density and, particularly, has substantially no limitation on the number of write operations that can be performed. But DRAM is susceptible to damage from radiation, needs periodic refreshing to retain stored data, and is volatile, that is, it loses data in the absence of power.

In contrast, conventional nonvolatile memories such as EPROM, EEPROM and Flash Memory can maintain stored data even in the absence of power. However, these nonvolatile memories are relatively costly, have low integration density, require extremely high voltages for relatively long time periods to write and erase data, and, most undesirably, allow very limited cycles of write and erase operations compared to DRAM. Therefore, conventional nonvolatile memories are generally used in read-only or read-mostly applications.

Recently, a new type of nonvolatile memory, so called the ferroelectric RAM (FeRAM), is getting attention in the semiconductor industry. Since FeRAM stores digital data as two stable polarization states of the ferroelectric material, the polarization states being maintained when power is removed from FeRAM, it can maintain stored data even in the absence of power. In other words, FeRAM has nonvolatility. Moreover, as a change of polarization states occurs in substantially under 100 ns, read/write operations of FeRAM can be performed as fast as those of DRAM. In addition, FeRAM is highly resistant to radiation damages and requires a low operation voltage. Therefore, FeRAM has been recognized as a next generation mainstream memory selection.

However, several challenges still remain in order to provide commercially practicable FeRAM. The ferroelectric thin film used in a FeRAM should maintain high remnant polarization, and be substantially free of fatigue (a reliability failure caused by the decrease of the magnitude of remnant polarization under repeated polarization switchings). In addition, the processing temperature of the ferroelectric material should be low enough to be compatible with the conventional semiconductor fabrication process.

For example, ferroelectric capacitors constructed with perovskite-family ferroelectric materials such as PZT ($PbTiO_3$—$PbZrO_3$) are well known in the art. However, when a ferroelectric capacitor is fabricated by depositing a PZT film on a conventional Pt electrode, the magnitude of the remnant polarization of the ferroelectric thin film decreases with the number of times that the direction of polarization is switched, which is so called fatigue. Therefore, the FeRAM with PZT film can provide only a limited number of read/write cycles, failing to overcome the problems of conventional nonvolatile memories such as flash memory.

It has been reported that the fatigue failure originates from movement of oxygen vacancies and their entrapment at the electrode/ferroelectric interface. Under an external electric field, the oxygen vacancies generated in the ferroelectric film during the processing move towards the electrode/ferroelectric interface and get entrapped at the interface, which results in the loss of polarization.

Two possible approaches have been suggested to overcome the fatigue problem. One of them is to reduce the tendency for entrapment of oxygen vacancies by employing a multilayer electrode structure having conductive oxide electrodes such as $RuO_2$, as disclosed in U.S. Pat. No 5,491,102 issued to Desu et al. on Feb. 13, 1996.

Another approach is to use ferroelectric materials other than PZT without changing the conventional electrode structure. Such approach is disclosed in U.S. Pat. No. 5,519,234 issued to Paz de Araujo et al. entitled "Ferroelectric dielectric memory cell can switch at least Giga cycles and has low fatigue-has high dielectric constant and low leakage current". U.S. Pat. No. 5,519,234 discloses a memory cell capacitor with extremely low fatigue comprising a layered superlattice material having formula $A1_{w1}^{+a1}A2_{w2}^{a2}Aj_{wj}^{+aj}S1_{x1}^{+s1}S2_{x2}^{+s2}Sk_{xk}^{+sk}B1_{y1}^{+b1}B2_{y2}^{+b2}Bj_{yj}^{bj}Q_a^{-2}$, wherein A1, A2, , Aj represent A-site elements in a perovskite-like structure, B1, B2, , Bj represent B-site elements in a perovskite-like structure, S1, S2, , Sk represent superlattice generator elements, and Q represents an anion. One or more perovskite ferroelectric layers which have a rigid crystal lattice and a non-ferroelectric layer which has a less rigid structure alternate with each other throughout the crystal of the layered superlattice material. According to the U.S. Pat. No. 5,519,234, the non-ferroelectric layers between the perovskite ferroelectric layers absorb the shock generated in the perovskite ferroelectric layers by repeated switching of polarization and allow the ferroelectric thin film to maintain its high polarizable state. SBT, an exemplary layered superlattice material, maintains relatively high remnant polarization and low fatigue after $10^{12}$ switching cycles. It should be noted, however, that excellent ferroelectric properties of SBT in bulk had already been reported in various publications (see Solid State 3, 651(1961), G. A. Smolenski et al.; J. Am. Ceram. Soc. 45, 166(1962), E. C. Subbarao; J, Phys. Chem. Solids 23, 655(1962), E. C. Subbarao). The significance of U.S. Pat. No. 5,519,234 lies in that the layered superlattice materials such as SBT were found to exhibit extremely low fatigue even in the form of thin film and were used in fabricating FeRAM.

Meanwhile, $Bi_4Ti_3O_{12}$ (BTO) is another Bi-layered perovskite ferroelectric material which is known to show good ferroelectricity in bulk. However, BTO thin film has not been considered suitable for non-volatile ferroelectric memory, since the BTO thin film has a serious fatigue problem and Ti ions in the BTO thin film are known to diffuse into a silicon substrate to form conductive titanium silicide during heat treatment. The U.S. Pat. No. 5,519,234 solved these problems by sandwiching BTO thin film between buffer layers made of $SrTiO_3$.

Even though SBT thin film on the metal electrode exhibits extremely low fatigue, it has two disadvantages. First, SBT has lower remnant polarization (2Pr≈20 mC/) than that of PZT (2Pr≈35 mC/), which makes it difficult for the change of the polarization states to be sensed by a sense amplifier. Second, the existence of the intermediate inetastable non-ferroelectric fluorite phase (Appl. Phys. Lett. 73, 2518 (1998), S. J. Hyun et al.) requires SBT thin film to be annealed at high temperature ranging from 750 to 850 for extended periods in order to transform SBT material as deposited to have the layered perovskite phase exhibiting ferroelectricity. The high temperature annealing imposes serious constraints on the back-end process such as interconnect formation and contact metalization process which usually require a relatively low thermal budget.

Moreover, the buffer layers sandwiching the BTO film complicate the fabrication process and increase the memory size, which results in increases the operating voltage and power consumption.

SUMMARY OF THE INVENTION

The object of the present invention is to provide a nonvolatile ferroelectric capacitor comprising a thin film of layered perovskite ferroelectric material which is substantially free of fatigue on the conventional metal electrode and has a large value of remnant polarization and low processing temperature.

The present invention provides a nonvolatile ferroelectric capacitor employing layered perovskite ferroelectric material which is obtained by substituting a non-volatile element such as La for the volatile Bi element in BTO.

The present invention also provides a nonvolatile ferroelectric memory comprising a nonvolatile ferroelectric capacitor with a thin film of layered perovskite ferroelectric material obtained by substituting a non-volatile element such as La for the volatile Bi element in BTO.

DESCRIPTION OF THE PREFERRED EMBODIMENT

The assertions on fatigue phenomenon in U.S. Pat. No. 5,519,234 do not explain why BTO having similar crystal structure as SBT exhibits fatigue. In order to determine the fatigue mechanism of layered perovskite ferroelectric materials and to understand the stability of oxygen in layered perovslcite ferroelectric materials, BTO and SBT thin films were subjected to post-annealing in oxygen ambient of $10^{-4}$ torr and 400 torr. Thereafter XPS (X-ray Photoemission Spectroscopy) tests were conducted on the reduced ($10^{-4}$ torr) and oxidized (400 torr) thin films of BTO and SBT.

Figure 1A:
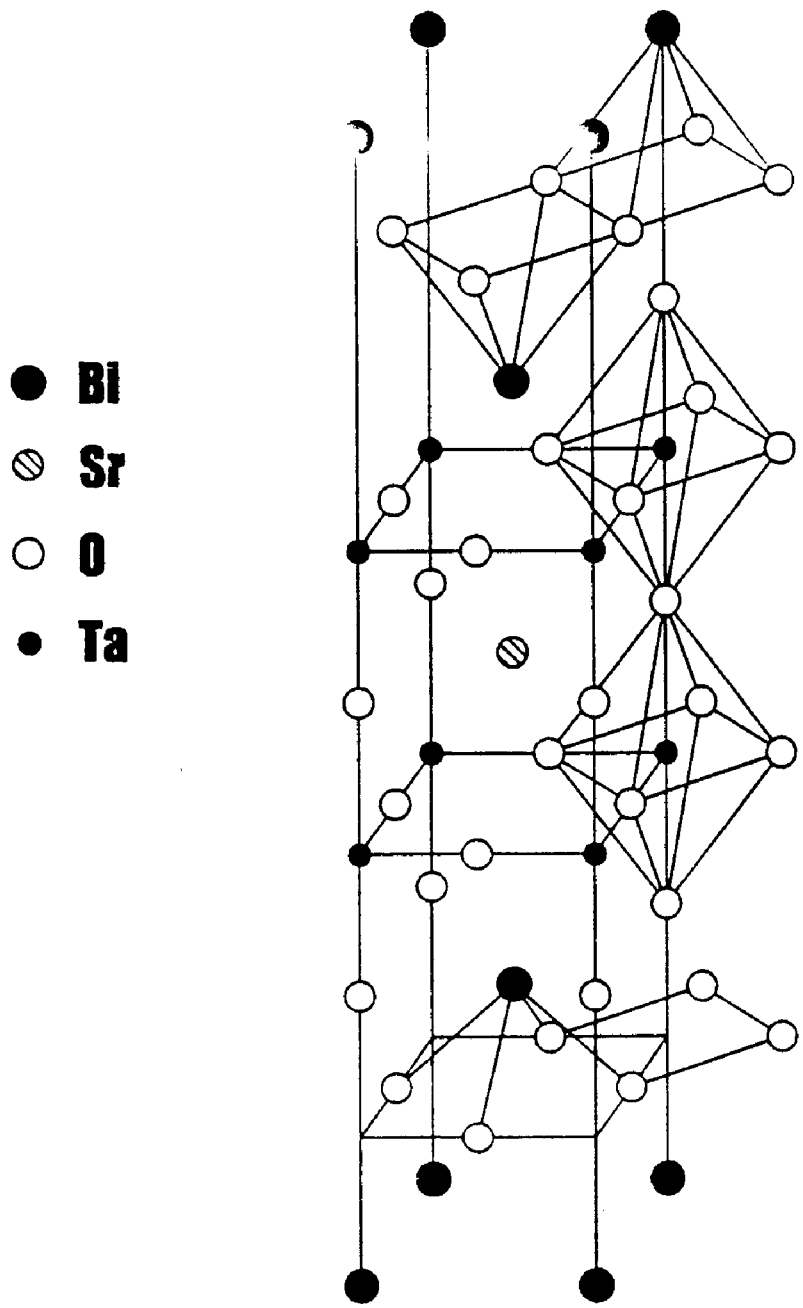
FIG. 1a is an illustration of the primitive unit cell of $SrBi_2Ta_2O_9$ crystal.
Figure 1B:
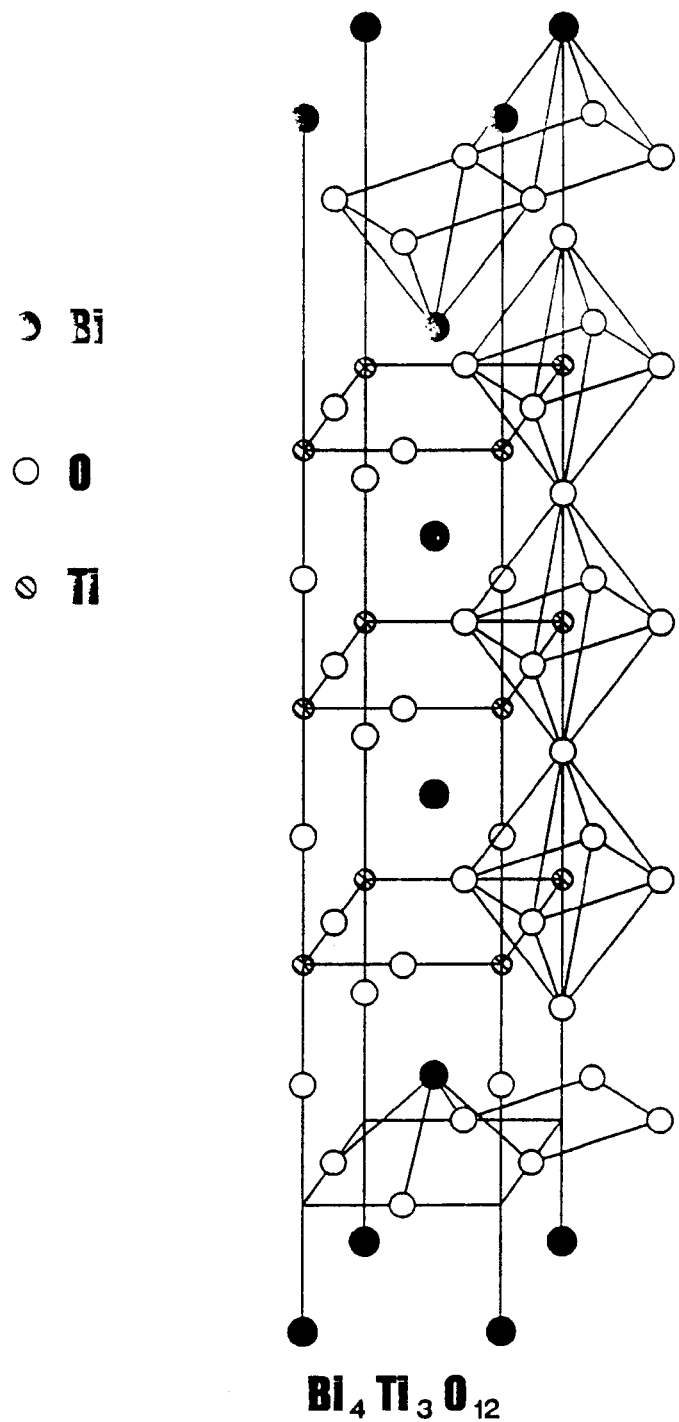
FIG. 1b is an illustration of the primitive unit cell of $Bi_4Ti_3O_{12}$ crystal.

FIG. 1a and FIG. 1b show the crystal structures of SBT and BTO, respectively. Both BTO and SBT have the Bi-layered perovskite structure. This structure can be expressed by a general formula of $(Bi_2O_2)^{2+}(A_{x-1}B_xO_{3x+1})^{2-}$, wherein A can be mono-, di-, or trivalent ions or a mixture thereof, B represents $Ti^{4+}$, $Nb^{5+}$ and $Ta^{5+}$, etc., and x can have values of 2, 3, 4 etc. $(Bi_2O_2)^{2+}$ and $(A_{x-1}B_xO_{3x+1})^{2-}$ represent the non-ferroelectric layer and the perovskite layer, respectively. The major differences in the crystal structures of BTO and SBT are the number of the metal-oxygen octahedra and the constituent elements of the perovskite layer. For SBT, A=Sr, B=Ta, and x=2, while for BTO, A=Bi, B=Ti, and x=3.

Figure 2A:
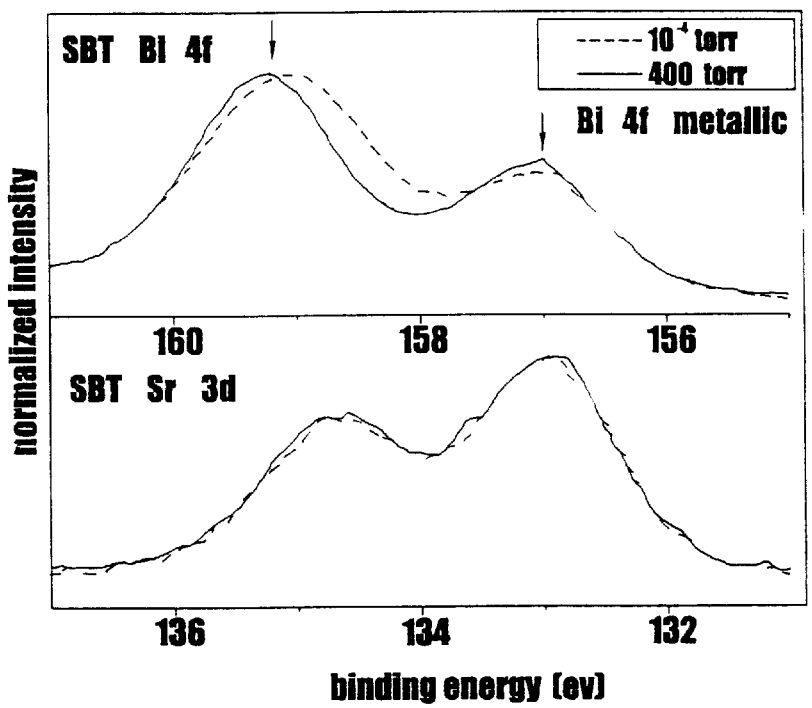
FIG. 2a is an illustration of XPS test results of reduced and oxidized thin films of $SrBi_2Ta_2O_9$.

FIG. 2a shows the photoemission spectra of Bi 4f and Sr 3d core levels of the reduced (broken line) and oxidized (solid line) thin films of SBT. The Bi 4f peak for the reduced SBT thin film is shifted toward a lower binding energy side, while the Sr 3d peak of the reduced SBT thin film nearly coincides with that of the oxidized SBT thin film. The width of the Sr 3d peak of the reduced SBT thin film is nearly the same as that of the oxidized SBT thin film. These experiment results teach that, for the reduced SBT thin film, most oxygen vacancies are produced in the vicinity of the volatile Bi atoms of the $Bi_2O_2$ layers.

Figure 2B:
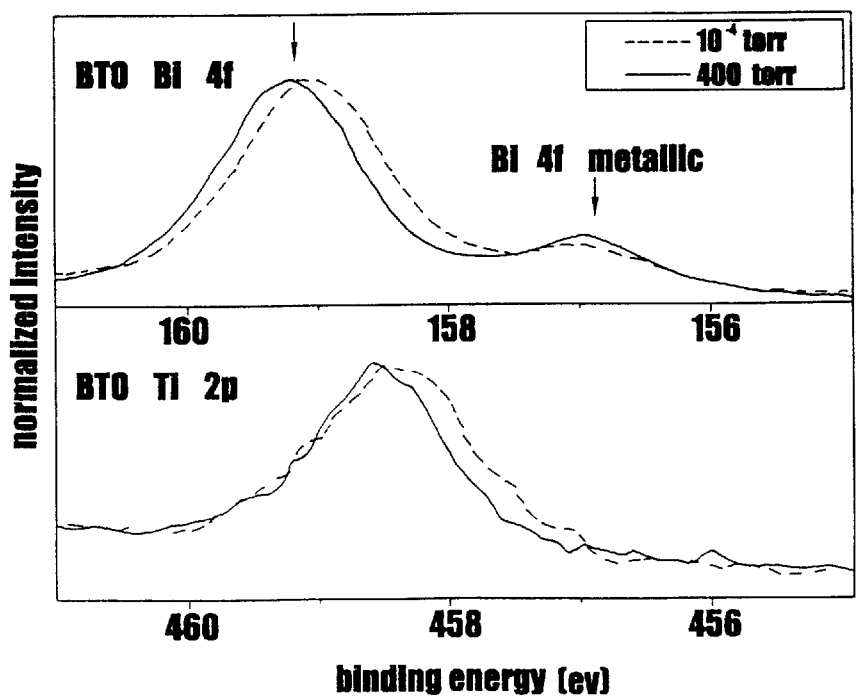
FIG. 2b is an illustration of XPS test results of reduced and oxidized thin films of $Bi_4Ti_3O_{12}$.

FIG. 2b shows the photoemission spectra of Bi 4f and Ti 2p core levels of reduced (broken line) and oxidized (solid line) thin films of BTO. The Bi 4f peak and Ti 2p peak for the reduced BTO film are shifted toward a lower binding energy side, and the Ti 2p peak for the reduced BTO film is broader than that for the oxidized BTO film. These experimental results teach that, for the reduced BTO thin film, oxygen vacancies were generated not only in the neighborhood of the Bi atoms of the $Bi_2O_2$ layer but also in the perovskite layers.

The difference in the oxygen stabilities of BTO thin film and SBT thin film results from the difference in local constituent elements of the perovskite layer, and this difference in oxygen stabilities explains why BTO and SBT thin films exhibit totally different fatigue behavior. That is, SBT thin film shows substantially no fatigue since oxygen vacancies are rarely produced in the perovskite layer. On the other hand, BTO thin film exhibits fatigue because oxygen vacancies are easily generated around the volatile Bi atoms in the perovskite layer.

Therefore, it can be concluded that BTO having relatively large value of remnant polarization ($\approx$60 mC/) in bulk and low processing temperature can provide an excellent ferroelectric material for FeRAM if the oxygen stability in the perovskite layer is improved. To confirm this conclusion, a ferroelectric capacitor was fabricated using $Bi_{4-x}La_xTi_3O_{12}$ obtained by substituting La for Bi of BTO.

Figure 3:
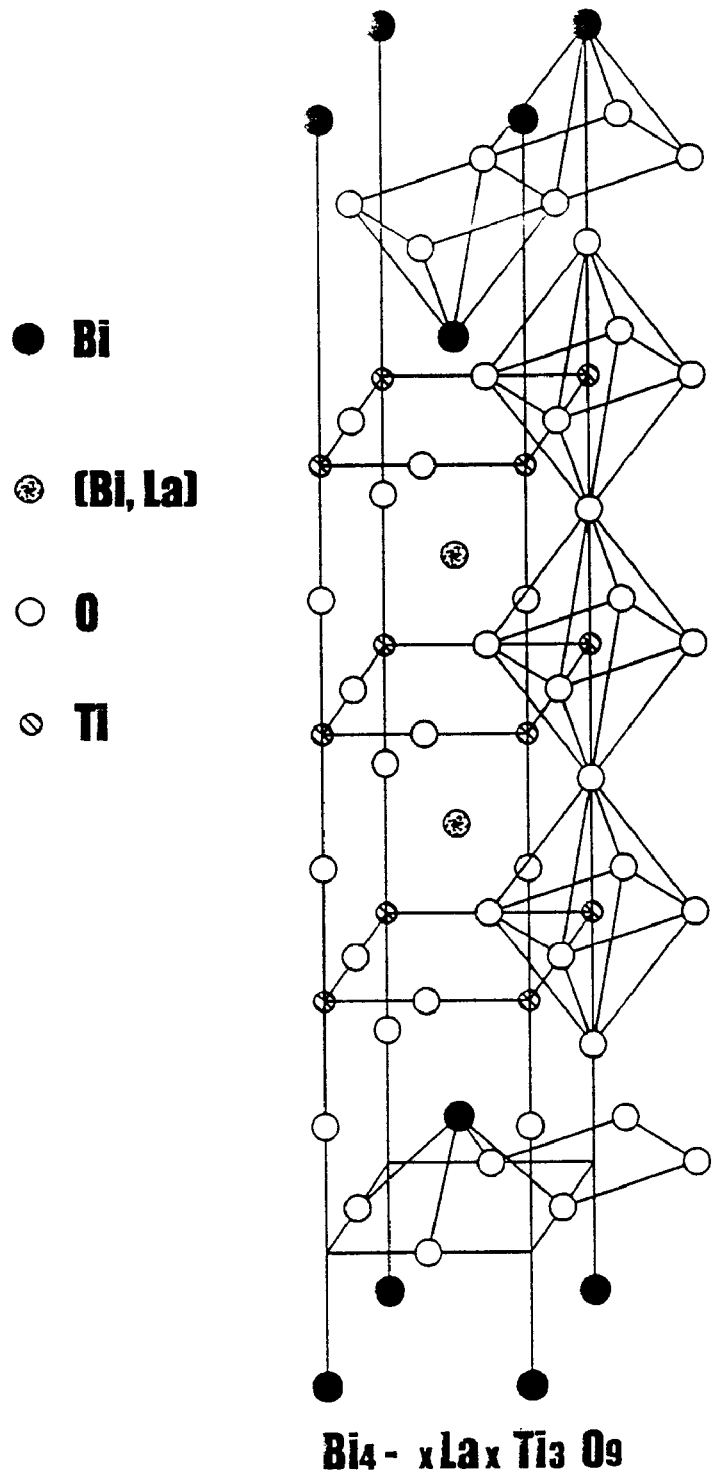
FIG. 3 is an illustration of the primitive unit cell of $Bi_{4-x}La_xTi_3O_9$ crystal.

FIG. 3 illustrates the crystal structure of $Bi_{4-x}La_xTi_3O_{12}$. It can be seen that La atoms occupy some of the A-sites in the perovskite layer of $Bi_{4-x}La_xTi_3O_{12}$. It is known that the substitution of La for Bi substantially usually occurs in the perovskite layer rather than in $Bi_2O_2$ layer (see Physical Review 122, 804–807(1961), E. C. Subbarao). However, some atoms of La might be substituted for the Bi atoms in the $Bi_2O_2$ layer.

The preferred embodiment of this invention will be described below referring to the accompanying drawings.

Figure 4:
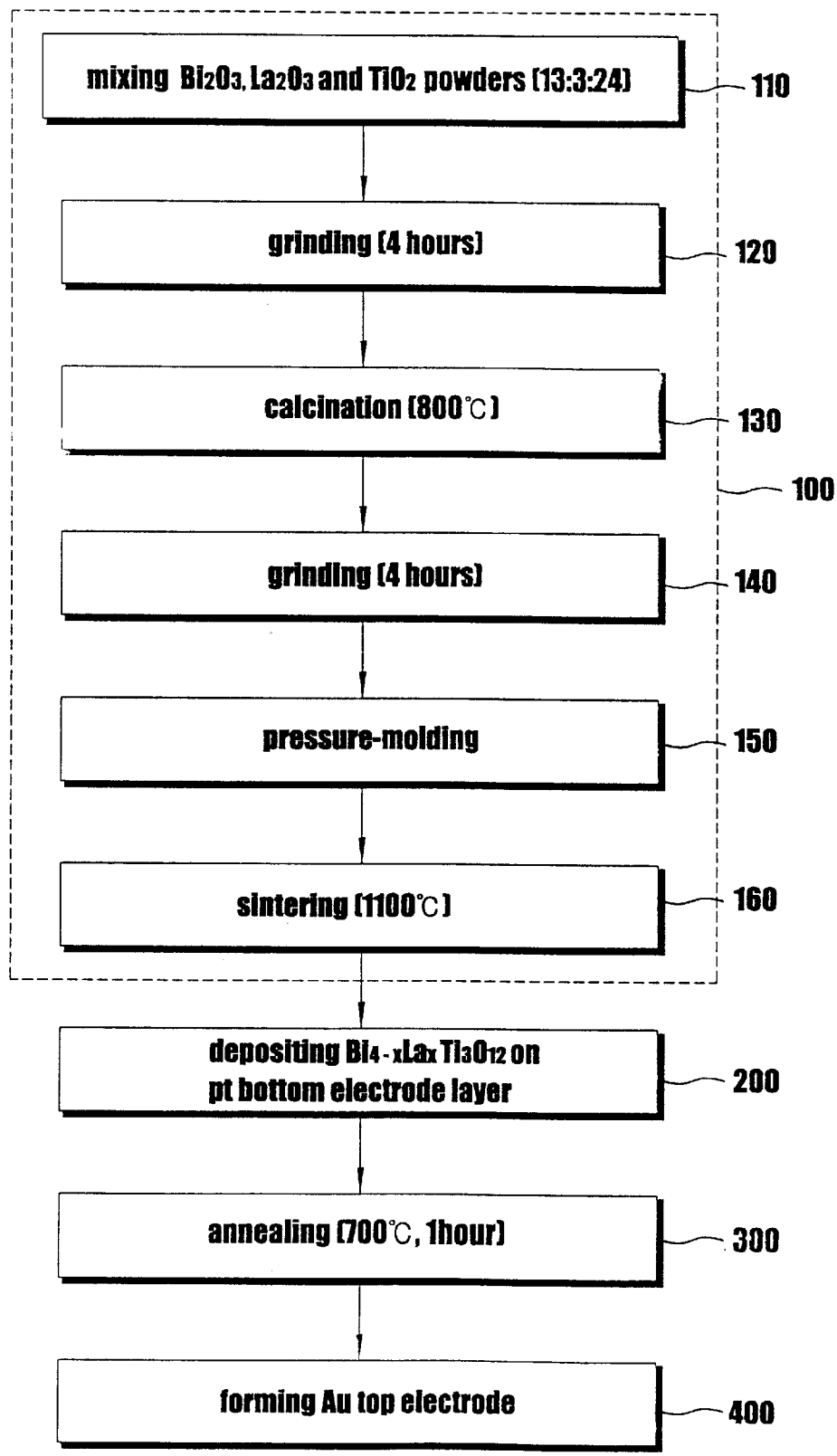
FIG. 4 is an flow chart of the fabrication process of a nonvolatile ferroelectric capacitor in accord a preferred embodiment of the present invention.

FIG. 4 shows the fabrication process flow of the ferroelectric capacitor having $Bi_{3.25}La_{0.75}T_3O_{12}$ thin film in accordance with the present invention. The known techniques for depositing ferroelectric thin films can be classified into two major categories, physical deposition and chemical deposition. The most commonly used methods among physical deposition techniques include RF magnetron sputtering, ion beam sputtering, and laser ablation. Recently, chemical methods of depositing ferroelectric films have become popular, for example metalorganic CVD and sol-gel deposition. In the preferred embodiment, $Bi_{3.25}La_{0.75}T_3O_{12}$ thin film is formed by PLD (Pulsed Laser Deposition) which is well known in the art as a formation method of oxide thin films. However, the scope of the present invention is not limited to a nonvolatile ferroelectric capacitor fabricated by PLD.

Step 110 to step 160 in FIG. 4 illustrate a process flow to make a $Bi_{3.25}La_{0.75}T_3O_{12}$ target for PLD. Powders of $Bi_2O_3$, $La_2O_3$, $TiO_2$ are mixed in mole ratio of 13:3:24 at step 110. The powder mixture is then ground for about 4 hours at step 120, and then subject to calcination at 800 (step 130). Proceeding to step 140, the calcinated mixture is ground for another 4 hours, and pressure-molded at step 150. The fabrication of the $Bi_{3.25}La_{0.75}T_3O_{12}$ target for PLD is completed by sintering the pressure-molded pellet at about 1100 (step 160).

$SiO_2$ layer of 50 Å, Ti layer of 200 Å and Pt bottom electrode layer of 2000 Å are deposited on a silicon substrate in that sequence. At step 200, $Bi_{3.25}La_{0.75}T_3O_{12}$ layer of 7000 Å is formed on the Pt bottom electrode layer at the substrate temperature of 400 by PLD using the $Bi_{3.25}La_{0.75}Ti_3O_{12}$ target. The substrate is then post-annealed at 700 for 1 hour in an oxygen atmosphere to change the phase of the deposited $Bi_{3.25}La_{0.75}T_3O_{12}$ thin film into the layered perovskite phase.

Figure 5:
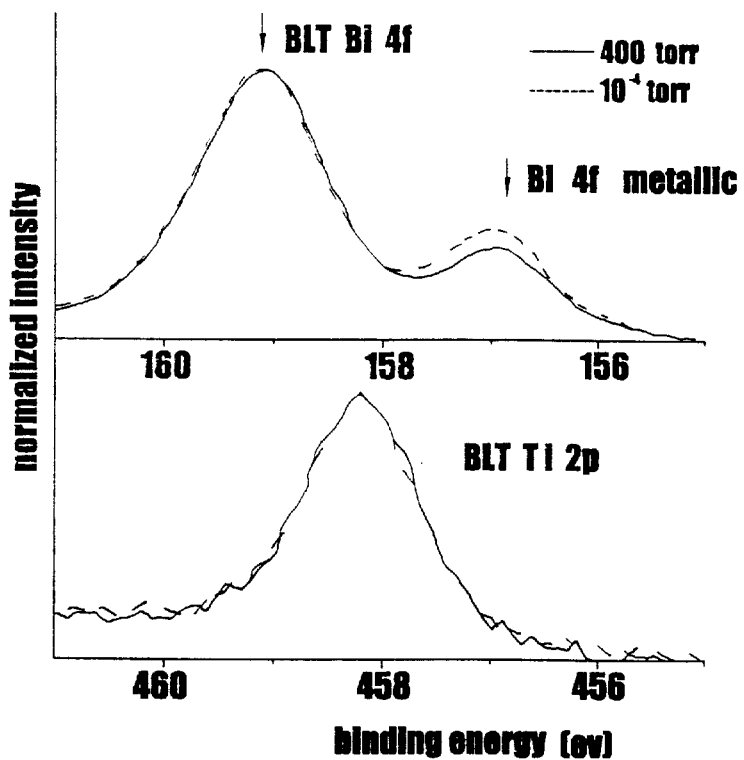
FIG. 5 is an illustration of XPS data of reduced and oxidized thin films of $Bi_{4-x}La_xTi_3O_9$.

FIG. 5 shows the XPS data of reduced (broken line) and oxidized (solid line) $Bi_{3.25}La_{0.75}T_3O_{12}$ thin films. The Bi 4f and the Ti 2p peaks of the reduced $Bi_{3.25}La_{0.75}T_3O_{12}$ thin film substantially overlap with those of the oxidized $Bi_{3.25}La_{0.75}T_3O_{12}$ thin film, which shows that the stability of oxygen in the perovskite layer was improved by the substitution of La.

Figure 6:
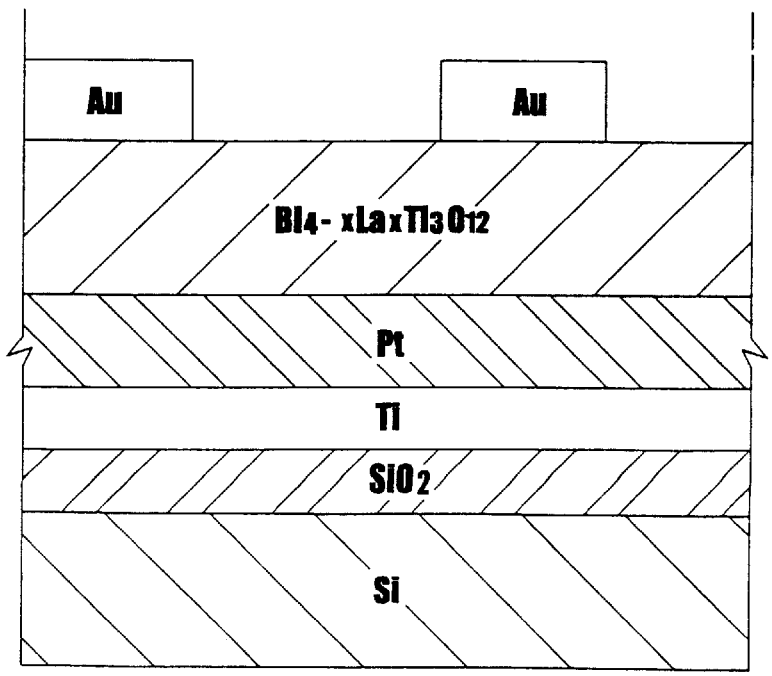
FIG. 6 is a cross sectional view of a nonvolatile ferroelectric capacitor fabricated in accordance with a preferred embodiment of the present invention.

In order to measure operation characteristics of the ferroelectric capacitor, a Au top electrode layer is deposited at room temperature by the thermal evaporation method using a shadow mask. FIG. 6 illustrates a cross section of the ferroelectric capacitor having $Bi_{3.25}La_{0.75}T_3O_{12}$ thin film.

Figure 7:
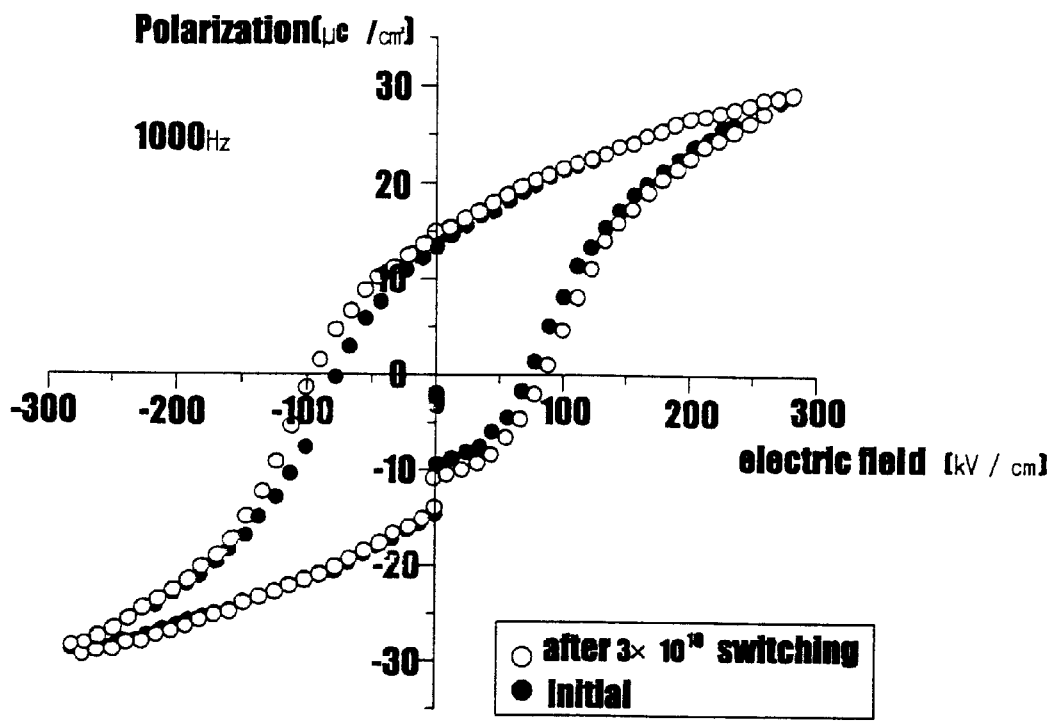
FIG. 7 shows hysteresis curves of $Bi_{3.25}La_{0.75}T_3O_{12}$ thin film before and after 3 010 switching cycles.

Hysteresis curves of the $Bi_{3.25}La_{0.75}Ti_3O_{12}$ thin film in FIG. 7 reveal that the ferroelectric thin film has a larger value of remnant polarization (Pr≈13 mC/) than that of SBT thin film and shows no asymmetric behavior which may result in imprint failure of memory cell. It should be noted that remnant polarization of the SBT film deposited by PLD is only about 3 mC/ (see Appl. Phys. Lett. 67, 572~574 (1995), R. Dat et al.). The solid and open circles in FIG. 7 represent the hysteresis curves before and after being subjected to 3 010 read/write cycles, respectively. The fact that hysteresis curves before and after 3 010 cycles substantially overlap with each other means that $Bi_{3.25}La_{0.75}T_3O_{12}$ thin film is substantially free of fatigue.

Figure 8:
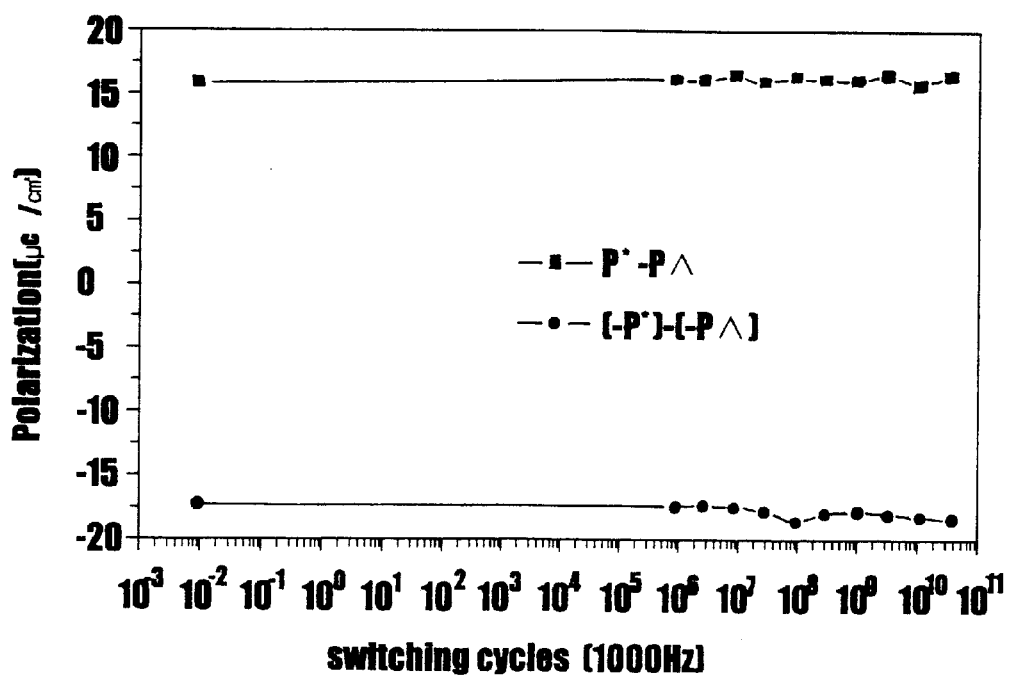
FIG. 8 is an illustration of results of PUND switching test.

FIG. 8 illustrates the results of PUND switching tests up to 3 010 cycles to evaluate fatigue characteristics of the $Bi_{3.25}La_{0.75}T_3O_{12}$ thin film. The test results in FIG. 8 confirmed that the difference between switched polarization (P*) and non-switched polarization (P^), (P*−P^), which plays critical role in reading out the stored data in ferroelectric memory cell, remains almost constant at 17 mC/, and thereby $Bi_{3.25}La_{0.75}T_3O_{12}$ thin film is substantially free of fatigue.

Figure 9:
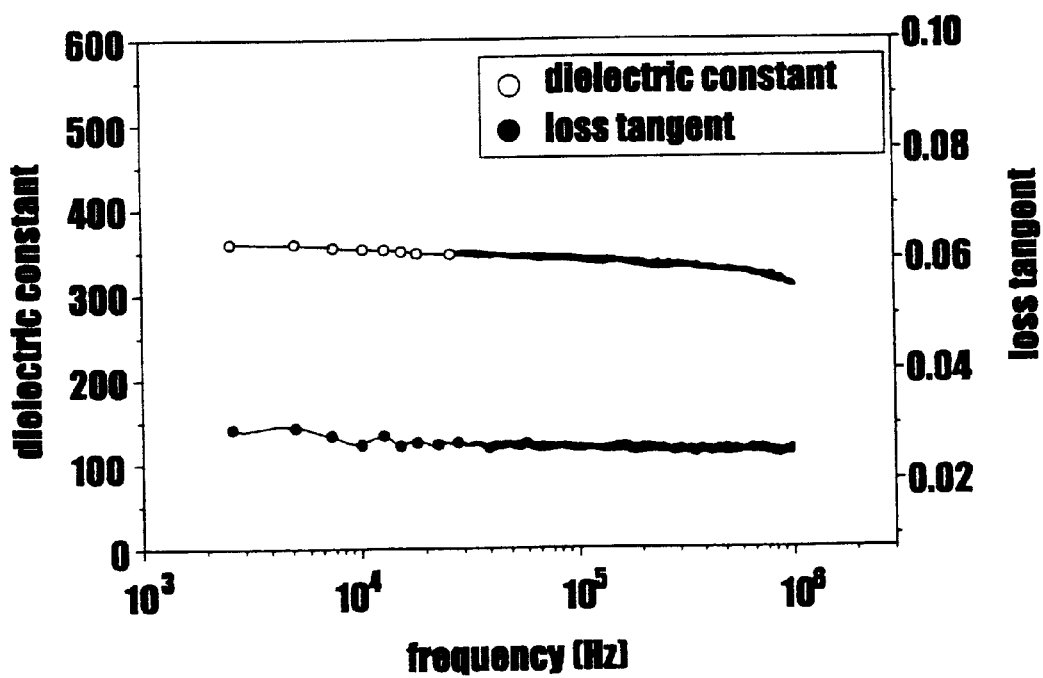
FIG. 9 is an illustration dielectric constant and loss tangent of $Bi_{3.25}La_{0.75}T_3O_{12}$ thin film.

FIG. 9 shows test results for dielectric constant and loss tangent of the $Bi_{3.25}La_{0.75}T_3O_{12}$ thin film. The film is practically nondispersive at the frequency range of 103 to 106 Hz and has a small value of loss tangent.

The $Bi_{3.25}La_{0.75}T_3O_{12}$ thin film is only an example of $Bi_{4-x}La_xTi_3O_{12}$ thin film. The scope of the present invention is not limited to the case of x=0.75 but covers all x values which make $Bi_{4-x}La_xT_3O_{12}$ thin film free of fatigue. According to publications by R. A Armstrong et.al (Mat. Res. Bull. 7, 1025(1972)), the contents of which are incorporated herein by reference, x corresponding to the solubility limit of La in BTO is 2.8 and the improvement of oxygen stability in perovskite layer, thus the suppressing of fatigue, may be achieved by substituting other non-volatile elements such as Pr, Nd, Sm, Eu, Gd, Tb, Dy, Ho, Er, Tm, Yb, Lu and a mixture thereof.

The structure and operation of a nonvolatile ferroelectric memory comprising a nonvolatile ferroelectric capacitor are well known in the art and is not provided herein. However, it will be understood that a nonvolatile ferroelectric capacitor according to this invention may be utilized therein.

Since $Bi_{4-x}La_xTi_3O_{12}$ thin film is substantially free of fatigue as described above, a nonvolatile ferroelectric capacitor having $Bi_{4-x}La_xTi_3O_{12}$ thin film can provide a high read/write endurance. Furthermore, the large remnant polarization of $Bi_{4-x}La_xTi_3O_{12}$ thin film enables the change of the polarization states to be easily sensed. In addition, the processing temperature of $Bi_{3.25}La_{0.75}T_3O_{12}$ thin film is lower than that of SBT, which makes it easier for the processing of BLT thin film to be incorporated into the conventional semiconductor fabrication process.

Because it is not necessary for the buffer layers to be formed between the metal electrode and the ferroelectric thin film, the fabrication process of a nonvolatile ferroelectric capacitor of this invention can be simplified and the size and the operating voltage of the nonvolatile ferroelectric capacitor can be reduced.

In view of the above, it can be seen that the objects of the invention are achieved and other advantageous results are attained.

Various changes could be made in the above construction without departing from the scope of the invention, and all matter contained in the above description or shown in the accompanying drawings is illustrative and not limitive of the full scope of the invention.

What is claimed is:

1. A nonvolatile ferroelectric capacitor comprising layered perovskite ferroelectric thin film of $Bi_{4-x}A_xTi_3O_{12}$, wherein said A component is nonvolatile and at least some atoms of said A component occupy the A-sites of perovskite layer of said $Bi_{4-x}A_xTi_3O_{12}$, and wherein x is larger than 0 and smaller than 4.

2. The nonvolatile ferroelectric capacitor of claim 1, wherein said A component includes one or more elements selected from the group consisting of Pr, Nd, Sm, Eu, Gd, Tb, Dy, Ho, Er, Tm, Yb, and Lu.

3. The nonvolatile ferroelectric capacitor of claim 1, wherein said A component is La and wherein x is larger than 0 and smaller than 2.8.

4. The nonvolatile ferroelectric capacitor of claim 3, wherein x is 0.75.

5. A nonvolatile ferroelectric memory comprising a nonvolatile ferroelectric capacitor with layered perovskite ferroelectric thin film of $Bi_{4-x}A_xTi_3O_{12}$, wherein said A component is nonvolatile and at least some atoms of said A component occupy the A-sites of perovskite layer of said $Bi_{4-x}A_xTi_3O_{12}$, and wherein x is larger than 0 and smaller than 4.

* * * * *